United States Patent
Ushijima et al.

(10) Patent No.: US 6,653,705 B2
(45) Date of Patent: Nov. 25, 2003

(54) ASPHERICAL MICROSTRUCTURE, AND METHOD OF FABRICATING THE SAME

(75) Inventors: Takashi Ushijima, Kanagawa (JP); Takayuki Yagi, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/969,780

(22) Filed: Oct. 4, 2001

(65) Prior Publication Data

US 2002/0045285 A1 Apr. 18, 2002

(30) Foreign Application Priority Data

Oct. 13, 2000 (JP) ........................................ 2000-312738

(51) Int. Cl.[7] ........................................... H01L 31/0232
(52) U.S. Cl. ............................ 257/432; 438/32; 385/33
(58) Field of Search ............................. 438/30, 65, 69, 438/71, 29, 22, 23, 32; 257/432, 434, 443; 385/33

(56) References Cited

U.S. PATENT DOCUMENTS

| 5,040,961 A | 8/1991 | Hamblen et al. ............... 425/6 |
| 5,143,659 A | 9/1992 | Hamblen et al. ............. 264/1.1 |
| 5,504,302 A | 4/1996 | Hentze et al. ......... 219/121.12 |
| 5,853,960 A | * 12/1998 | Tran et al. ................... 430/321 |
| 6,069,350 A | * 5/2000 | Ohtsuka et al. ........... 250/208.1 |
| 2002/0027300 A1 | * 3/2002 | Hartmann et al. ........... 264/1.1 |

FOREIGN PATENT DOCUMENTS

| JP | 5-150103 | 6/1993 |
| JP | 6-154934 | 6/1994 |
| JP | 7-104106 | 4/1995 |

* cited by examiner

Primary Examiner—Caridad Everhart
(74) Attorney, Agent, or Firm—Fitzpatrick, Cella, Harper & Scinto

(57) ABSTRACT

As a method of fabricating aspherical microstructures, a protruding microstructure is formed on a substrate, an aspherical-profile forming layer is formed on the substrate and the protruding microstructure, and the aspherical-profile forming layer is hardened. An aspherical profile is formed on the protruding microstructure due to a surface tension of the aspherical-profile forming layer in the step of forming the aspherical-profile forming layer, and the aspherical profile is maintained through the step of hardening the aspherical-profile forming layer.

49 Claims, 9 Drawing Sheets

ASPHERICAL MICROSTRUCTURE, AND METHOD OF FABRICATING THE SAME

BACKGROUND OF THE INVENTION

1. Field of the Invention

The present invention relates to an aspherical microstructure, such as an aspherical microlens array that is usable in fields of optoelectronics and the like, a mold or a master of a mold (in the specification the term "mold" is chiefly used in a broad sense including both a mold and a master of a mold) for forming an aspherical microstructure, a method for fabricating the aspherical microstructure, and so forth. In the specification, the term "aspherical" is used in a broad sense and includes "acylindrical".

2. Description of the Related Background Art

A microlens array typically has a structure of arrayed minute lenses each having a diameter from about 2 to 3 microns to about 200 or 300 microns and an approximately-semispherical profile. The microlens array is usable in a variety of applications, such as liquid-crystal display devices, light receivers and inter-fiber connections in optical communication systems.

Meanwhile, earnest developments have been made with respect to surface emitting lasers and the like that can be readily arranged in an array form at narrow pitches between the devices. Accordingly, there exists a significant need for microlens arrays with narrow lens intervals and a large numerical aperture (NA).

Likewise, light receiving devices, such as a charge coupled device (CCD), have been reduced in size as semiconductor processing techniques develop and advance. Therefore, also in this field, the need for microlens arrays with narrow lens intervals and a large NA is increasing. In the field of such a microlens, a desirable structure is a microlens with a large light-condensing efficiency which can highly efficiently utilize light incident on its lens surface.

Further, similar desires exist in the prospective fields of optical information processing, such as optical parallel processing-operations and optical interconnections.

Furthermore, display devices of active or self-radiating types, such as electroluminescent (EL) panels, have been enthusiastically studied and developed. Highly-defined and highly-luminous displays have been proposed. In such a display, there is a heightened desire for microlens arrays with improved luminescence and visibility, a large area, a small lens size, and a large NA, and which can be produced at a relatively low cost.

In general, the spherical aberration of a lens is likely to increase as its NA is enlarged while its spherical profile is maintained. Therefore, the surface of the lens needs to be aspherical such that compensation for the spherical aberration can occur. Similarly, in the case of a microlens, the profile of the microlens should be aspherical to improve its light-condensing efficiency. The need to improve the light-condensing efficiency is caused by the downsizing of optical devices.

In such a situation, the need for methods for fabricating aspherical microlens arrays and aspherical microlens arrays produced by these methods is increasing.

A conventional method for fabricating aspherical microlens arrays has been proposed. In a mask layer formed on a flat surface, openings are formed at positions of individual lenses and their surrounding positions. Through those openings, parts of the flat surface are chemically etched to form a mother substrate. Then, a mold for forming an aspherical microlens array is fabricated by using the mother substrate (see Japanese Patent Application Laid-Open No. 5(1993)-150103). However, when an isotropic etching using a chemical reaction is employed, etching of the substrate into a desired profile cannot be achieved if the composition and the crystalline structure of the substrate vary even slightly. In addition, etching will continue unless the substrate is washed immediately after the desired shape is obtained. When an aspherical microlens array must be precisely formed, deviation from the desired shape caused by excessive or over etching should be considered.

Further, another conventional method for fabricating aspherical microlenses has been proposed. Lens mold elements are tentatively formed in a lattice array by a punch having the desired radius of curvature for the lens mold element. The desired radius of curvature is obtained beforehand. The surface height error of a lens mold element surrounded by other lens mold elements is measured radially from the lens mold element, and the error is substituted by a correction amount. The radius of curvature of the punch is corrected based on that correction amount by a numerical control (NC) abrasion machine. Then, a microlens mold with a desired aspherical surface is accurately formed using the corrected punch (see Japanese Patent Application Laid-Open No.6(1994)-154934).

In this method, however, much time is required to form a large number of concave molds over a large area. Further, it is difficult to fabricate concave molds with a uniform profile on the surface of the substrate when the punch's durability is insufficient.

Furthermore, still another conventional method for fabricating aspherical microlens arrays has been proposed. First, a photosensitive resin is deposited on a substrate. Next, an array of cylindrical resin layers are formed, in accordance with the required lens number and the intervals of a lens array, by using photolithography. Then, the cylindrical resin layers are thermally processed to deform them into spherical resin layers. The substrate is dry-etched using the spherical resin layers as a mask, and a profile similar to the profile of the mask is transferred onto the substrate. Then, the thus-fabricated mother substrate is used as a mold (see Japanese Patent Application Laid-Open No.7(1995)-104106). In this method, an aspherical microlens array can be provided when the dry etching is performed such that the etching rate of the substrate is greater than the etching rate of the mask.

In this method, however, it is difficult to fabricate an aspherical microlens array with a large fill-factor since the dry etching is conducted using disk-shaped resin masks and a flat portion remains on the etched mother substrate.

SUMMARY OF THE INVENTION

It is an object of the present invention to provide a method of fabricating an aspherical microstructure, which can readily fabricate and control the aspherical profile of the microstructure, and increase the fill-factor and the size of the aspherical microstructure; a method of fabricating a mold used to form an aspherical microstructure, such as an aspherical microlens array, an aspherical fly-eye lens, and an aspherical lenticular lens; a method of fabricating an aspherical microstructure using the mold; and an aspherical microstructure. More particularly, it is an object to provide a mold for forming an aspherical microlens array. It is an additional object to provide a method of fabricating such a mold, and a method of fabricating the aspherical microlens array using the mold.

The present invention is generally directed to a method of fabricating an aspherical microstructure, which includes a step of forming a protruding microstructure on a substrate, a step of forming an aspherical-profile forming layer on the substrate and the microstructure, and a step of hardening the aspherical-profile forming layer. An aspherical profile is formed on the microstructure due to a surface tension of the aspherical-profile forming layer during the step of forming the aspherical-profile forming layer, and the aspherical profile is maintained in the step of hardening the aspherical-profile forming layer.

With this method, a curvature of the microstructure can be increased and the aspherical profile can be readily fabricated and regulated, since the protruding microstructure is formed on the substrate using electroplating, for example, and the aspherical profile is formed on the protruding microstructure utilizing the surface tension of the aspherical-profile forming layer. Further, the fill-factor can be increased by forming another layer on the aspherical-profile forming layer, and an array of aspherical structures with a large area can also be constructed.

More specifically, the following constructions can be preferably adopted based on the above fundamental construction.

The step of forming the protruding microstructure can include a step of preparing a substrate with a conductive portion, a step of forming an insulating mask layer on the conductive portion of the substrate, a step of forming at least one opening in the insulating mask layer to expose the conductive portion at the opening, and a step of forming an electroplated or electrodeposited layer in the opening and about the insulating mask layer around the opening using electroplating or electrodeposition. This method of forming the protruding microstructure can make it easier to obtain a microstructure with a large curvature and an array structure with a large area. With this method, the opening can have a circular shape or a slit shape, a plurality of openings with a common shape can be formed in the insulating mask layer, a plurality of regularly arranged openings can be formed in the insulating mask layer, and the electroplated or electrodeposited layer can have an approximately-semispherical shape or an approximately-semicylindrical shape. Those shapes are appropriately determined according to the application of the microstructure.

The aspherical-profile forming layer may be formed after the insulating mask layer is removed. When the insulating mask layer has no adverse influences, that layer need not be removed.

Here, electroplating and electrodeposition will be described with reference to FIG. 9. Where the electroplating is effected at a minute opening (which is formed in an insulating mask layer 51 formed on a conductive layer 50 on a substrate 49) in an electroplating solution 53 containing ions such as metal ions, metal ions in the electroplating solution 53 move toward the opening. Deposition of the electroplating proceeds with its growth direction being isotropic, as illustrated in FIG. 9. Thus, a spherical or cylindrical layer 52 can be formed. When the size (diameter or width) of the opening is sufficiently smaller than the size of an anode plate (not shown) and metal ions are uniformly dissolved in the electroplating solution 53, the growth direction of the plated layer 52 is isotropic. Each aspherical microlens fabricated can have any size when applying the above process.

The size of the opening should be smaller than the desired diameter of the desired aspherical microlens. In order to better achieve an isotropic growth of the plated layer 52, the size of the opening is less than the diameter of the spherical structure. The size of the opening should be determined while considering the size of the aspherical microlens to be fabricated.

In the case of electroplating, the spherical plated layer is formed by the deposition of metal ions in the electroplating bath caused by the electrochemical reaction. The amount of the plated layer deposited can be readily controlled by controlling the plating time, the temperature of the electroplating liquid, the amount of current, and so forth. The following materials can be used as electroplating metal, for example. As a single metal, Ni, Au, Pt, Cr, Cu, Ag, Zn and the like can be employed. As an alloy, Cu—Zn, Sn—Co, Ni—Fe, Zn—Ni and the like can be used. Any material can be used so long as electroplating is possible. Ni, Cr, and Cu are especially preferable as electroplating materials for molds for aspherical microlens arrays since those materials make it possible to readily perform a gloss plating.

With respect to the size and so forth, electrodeposition is the same as above. As electrodeposition liquids, electrodepositable organic compounds (acryl-series resin and the like in the case of the anionic-type electrodeposition, and epoxy-series resin and the like in the case of the cationic-type electrodeposition) can be used.

Alternatively, the step of forming the protruding microstructure can include a step of forming a reflow layer in a desired pattern on the substrate, and a step of performing a reflow-processing of the reflow layer to form the protruding microstructure. The reflow layer subjected to the reflow-processing can have an approximately-semispherical shape or an approximately-semicylindrical shape.

The number of the protruding microstructures can be single or plural. The plurality of the protruding microstructures can have a common profile, and can be regularly arranged. The protruding microstructure can have an approximately-semispherical shape or an approximately-semicylindrical shape.

The aspherical-profile forming layer can be formed using a spin-coat method, a dip-coat method, or a chemical vapor deposition (CVD) method. The aspherical-profile forming layer can also be formed of a plastic material by using the CVD method, and deformed into an aspherical profile in a thermoplastic manner. The aspherical-profile forming layer can be formed of an organic material, an inorganic material, a metal, a metal compound, or the like. That material is appropriately determined according to the application of the microstructure. The aspherical-profile forming layer can be formed of such a material, so far as the material can have a desired surface tension, can be hardened, and, if necessary, has no adverse influences on the formation of a fly-eye forming layer.

Further, when a CVD method employing a plastic material is used, the aspherical-profile forming layer is processed such that a surface tension can act on its surface profile and the aspherical-profile forming layer formed by the CVD method can have a desired aspherical profile. In this case, the aspherical profile can be controlled by processing conditions, processing time, and so forth. The fabrication method of the aspherical-profile forming layer is not limited to the above method. For example, a spray-coat method can be used so far as a material with no adverse influences on the formation of the fly-eye forming layer can be deposited with a desired surface tension. In this case, the aspherical profile can be controlled by the spray amount, a viscosity coefficient of a spraying liquid, and so forth.

The thus-fabricated substrate with the aspherical profile can be directly used as a mold for an aspherical microlens array or the like. Alternatively, the thus-fabricated substrate can be used as such a mold after the surface of the substrate is coated with a material of Cr or the like having excellent chemical stability and mechanical strength.

The fabrication method of this invention can further include a step of forming a fly-eye forming layer on the aspherical-profile forming layer to form a fly-eye construction on a plurality of the protruding microstructures. In this case, the fly-eye forming layer can be formed until the fill-factor of the fly-eye construction reaches approximately 100%.

The fly-eye construction can be obtained by forming the fly-eye forming layer on the aspherical profile and joining adjacent sides of the protruding microstructures along the diagonal direction. Thus, even a mold for an aspherical microlens array with the fill-factor of about 100% can be fabricated.

The fly-eye forming layer can be formed of an organic material, an inorganic material, a metal, a metal compound, or the like, so far as a material of the layer can be used in an isotropic-growth method and can be employed as a mold. Also in this case, chemical stability and mechanical strength of the thus-fabricated mold can be improved by coating the surface of the mold with a material of Cr or the like having excellent corrosion and abrasion resistivities. The fly-eye forming layer can be formed using an electroplating method, an electroless plating method, a CVD method, or the like. The fabrication method of the fly-eye forming layer can be determined depending on a material of the aspherical microstructure.

For example, when the electroplating method is used, the aspherical-profile forming layer itself can be used for the electroplating if this layer is conductive. Where the aspherical-profile forming layer exhibits no conductivity, a conductive layer is formed on the layer using a sputtering method, a resistor heating method, an electron-beam evaporation method, a CVD, an electroless plating, or the like. Thus, electroplating can be performed. When the fly-eye forming layer is isotropically grown by the electroplating, the fly-eye construction can be formed with the profile of each protruding microstructure being maintained aspherical.

When the electroless plating method is used, the aspherical-profile forming layer itself can be used for the electroless plating if this layer is suitable for the electroless plating. When the aspherical-profile forming layer is unsuitable for the electroless plating, the substrate surface needs to be subjected to an activation process with an activating liquid, or a material suitable for electroless plating needs to be formed on the substrate using a sputtering method, a resistor heating method, an electron-beam evaporation method, a CVD, or the like. Thus, electroless plating can be performed. Also here, when the fly-eye forming layer is isotropically grown by the electroless plating, the fly-eye construction can be formed with the profile of each protruding microstructure being maintained aspherical.

When the CVD method is used, the aspherical-profile forming layer itself can be used for the CVD if this layer is resistant to CVD conditions. Also here, when the fly-eye forming layer is isotropically grown by the CVD method, the fly-eye construction can be formed with the profile of each protruding microstructure being maintained aspherical.

The substrate with the aspherical profile obtained by the above fabrication methods has the fly-eye construction, and this substrate can be used as a mold for an aspherical microlens array with the fill-factor of about 100% (i.e., without any optically unusable portions). An aspherical microlens array obtained by molding using this mold has the same profile as that of the mold.

The aspherical microstructure can be a mold for a microstructure array such as a mold for an aspherical microlens array. The substrate, the protruding microstructure, and the aspherical-profile forming layer can be formed of transparent material, respectively. In this case, the microstructure can be directly used as an aspherical microlens array.

In the present invention, a mold for an aspherical microlens array or the like can be fabricated by using the above aspherical microstructure as a master mold, and the profile of an aspherical microlens array or the like molded by using this mold is identical with the profile of the above aspherical microstructure.

The mold for an aspherical microlens array or the like can be fabricated directly on the above substrate using a method, such as a spin-coat method, a dip-coat method, a CVD method, an electroplating method, or an electroless plating method. Accordingly, even when its array increases, it can be readily fabricated with a large size. Further, the size and profile of the aspherical microstructure can be readily and precisely controlled at each fabrication step. Therefore, the lens shape and size of an aspherical microlens array fabricated by that mold can be readily and precisely controlled.

In those cases, the profile of the electroplated layer grown through the opening can be approximately-semispherical as illustrated in FIG. 9, so that the NA of the thus-obtained aspherical microlens can be enlarged.

The present invention is also directed to an aspherical microstructure which includes a substrate, a protruding microstructure formed on the substrate, and an aspherical-profile forming layer formed and hardened on the substrate and the microstructure. An aspherical profile is formed on the microstructure due to a surface tension of the aspherical-profile forming layer.

These advantages, as well as others will be more readily understood in connection with the following detailed description of the preferred embodiments of the invention in connection with the drawings.

DESCRIPTION OF THE PREFERRED EMBODIMENTS

A first embodiment of a mold for an aspherical microlens array of the present invention will be described with reference to FIGS. 2A to 2D, which are cross-sectional views in the horizontal direction of adjacent elements arranged in a two-dimensional array. In the first embodiment, a silicon wafer with sides of 1.5 inches×1 inch is used as a substrate 4. The wafer 4 is thermally oxidized using an oxidizing gas, and layers of silicon dioxide with a thickness of 1 μm are formed on opposite surfaces of the wafer 4. Pt is then layered with a thickness of 200 nm on the above wafer 4 using a sputtering method. An electrode layer 5 is thus formed.

Figure 2A:
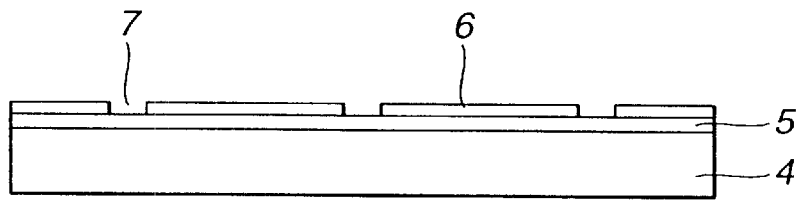
FIGS. 2A to 2D are cross-sectional views illustrating steps of fabricating a mold for an aspherical microlens array of a first embodiment according to the present invention.

A photoresist is then deposited to form an insulating mask layer 6. Further, exposure and development of the photoresist are performed using a photolithography to expose the electrode layer 5 in a predetermined pattern and form a plurality of openings 7 in the photoresist, as illustrated in FIG. 2A. The opening 7 has a circular shape with a diameter of 5 μm. Openings 7 are arranged in a 700×700 two-dimensional array at common intervals of 25 μm, corresponding to the aspherical microlens array.

The electrode layer 5 or a conductive layer can be formed by a thin-film forming method, such as a sputtering method, a resistor heating method, an electron-beam evaporation method, a CVD method, an electroless plating method, or the like.

The insulating mask layer 6 with openings 7 can also be formed using semiconductor photolithography and etching, which can form a minute opening. Here, the mask layer 6 needs to be insulating for electroplating and insulate the conductive layer 5 from an electroplating liquid. The mask layer 6 can be formed of any insulating material, such as an organic material and an inorganic material. At the same time, the mask layer 6 should be anti-corrosive to the electroplating liquid. The opening 7 can be single, or one-dimensionally arranged. In the first embodiment, since the mask layer 6 is formed of a photoresist, the etching step of the mask layer 6 can be omitted.

Figure 2B:
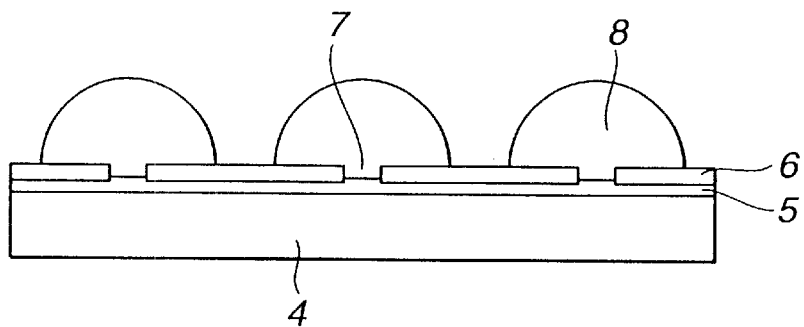
Figure 9:
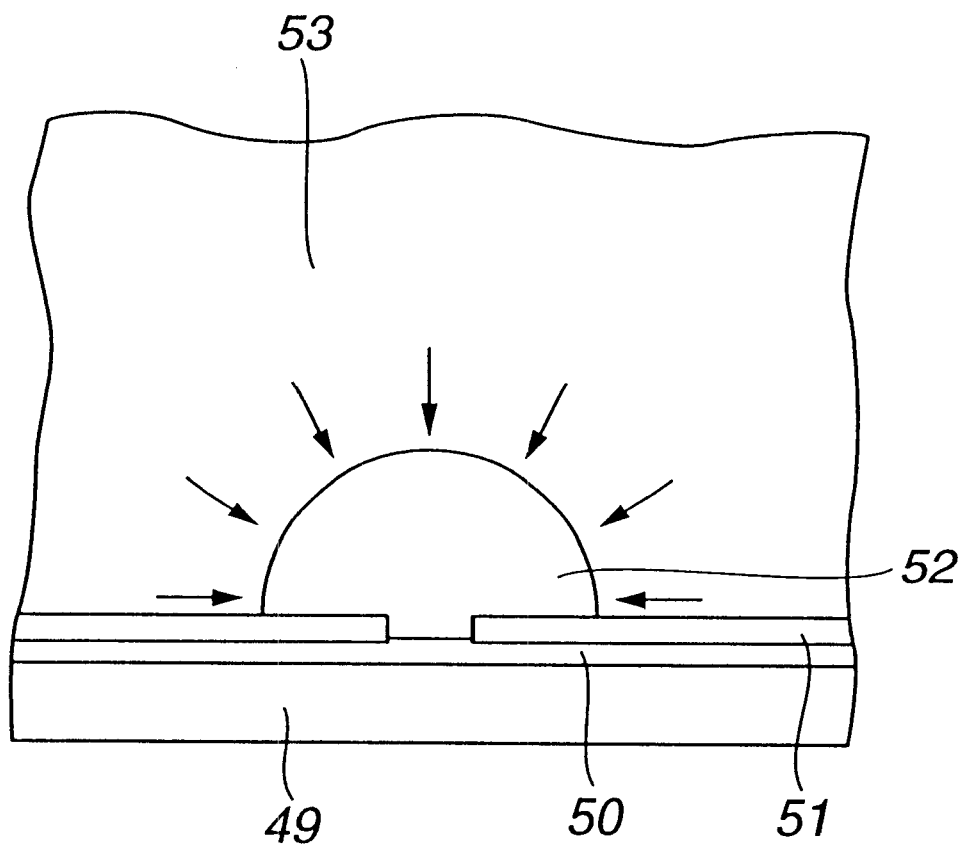
FIG. 9 is a cross-sectional view illustrating the principle of electroplating a spherical structure of the present invention.

Ni electroplating is then performed while the electrode layer 5 is used as a cathode. A Ni electroplating bath containing nickel (II) sulfate, nickel (II) chloride, boric acid and brightener is used. The electroplating is conducted for five (5) minutes at the bath temperature of 50° C. and the cathode current density of 40 A/dm$^2$. An Ni plated layer 8 is initially deposited in the opening 7 and grows therein. The plated layer 8 gradually expands onto the mask layer 6, and an approximately-semispherical plated layer is thus formed, as illustrated in FIG. 2B, since the shape of the opening 7 is circular in this embodiment. The plated layer 8 is deposited until its diameter reaches about 20 μm. Thereby, the electroplated layer 8 with a large curvature can be formed on the opening 7 and the mask layer 6. The deposition amount of the plated layer 8 can be precisely controlled by plating conditions. In this electroplating process, the principle illustrated in FIG. 9 is used.

Figure 2C:
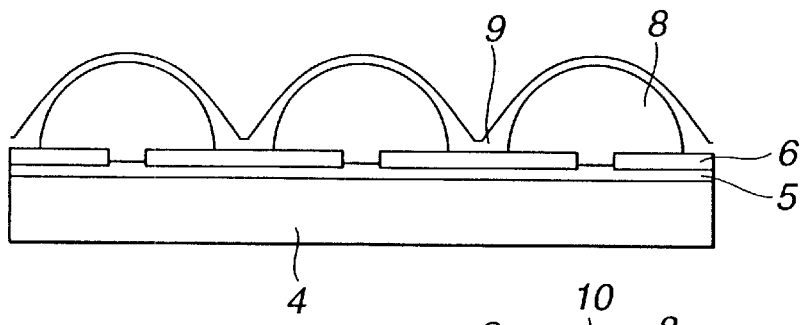

Then, a photoresist with a viscosity coefficient of about 20 cP is spin-coated on the substrate 4 at 3000 rpm for thirty (30) seconds. This photoresist is the same as that used in the photolithography process. A spin-coat layer 9 is thus formed on the plated layers 8 and the mask layer 6. Here, an aspherical profile is formed due to a surface tension of the photoresist of the spin-coat layer 9, as illustrated in FIG. 2C. Immediately after the spin-coating, the photoresist is thermally hardened at 120° C. for ten (10) minutes to obtain the spin-coat layer 9 of the photoresist with the aspherical profile.

Figure 1A:
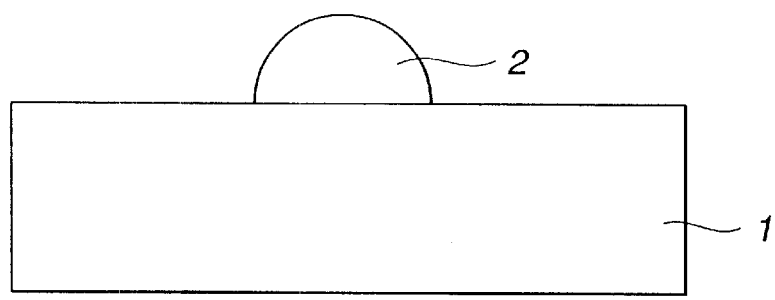
FIGS. 1A and 1B are cross-sectional views illustrating the principle of fabricating an aspherical microstructure of the present invention.
Figure 1B:
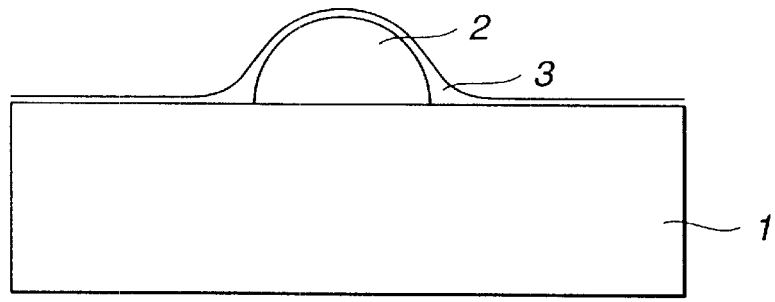

The principle of forming an aspherical profile will be described with reference to FIGS. 1A and 1B. All liquid has a tendency to reduce its surface area as much as possible. This is a phenomenon caused by the fact that molecules on the surface tend to be drawn into the liquid due to intermolecular forces between liquid molecules. The aspherical profile can be formed employing this phenomenon. As illustrated in FIGS. 1A and 1B, when a layer (an aspherical-profile forming layer 3) of liquid (or fluidified solid) is formed on a substrate 1 and a protruding microstructure 2, the fluid 3 tries to reduce its surface area as far as possible. Thus, a new profile can be formed at the skirts of the protruding microstructure 2. This new profile is an aspherical profile. The same effect can be achieved when an array of microstructures is formed.

When a material with a desired surface tension is deposited on the protruding microstructure 2 as the aspherical-profile forming layer 3, or, if necessary, when the material is further subjected to a process during which its surface tension acts on its aspherical profile, an aspherical profile can be formed and its configuration can be regulated.

Here, when a spin-coat method is used (this is the case of this embodiment), the thickness and the shape of the aspherical-profile forming layer 3 can be controlled by the viscosity coefficient of the coated liquid, the conditions of the spin coating, the coating period, and so forth. When a dip-coat method is used, the thickness and the shape of the aspherical-profile forming layer 3 can be controlled by the viscosity coefficient of a solution, and so forth.

When the aspherical-profile forming layer 3 obtained by the above coating method must be hardened by heat, radiation, electron beam, or the like, the aspherical-profile can also be controlled by leaving the layer 3 undisturbed for a period until it is hardened.

In the first embodiment, as described above, a curable organic solution is coated on the spherical plated layer 8 and the mask layer 6, using the spin-coat method, to obtain the aspherical-profile forming layer 9. When a material with a desired surface tension is used as the curable organic solution, an aspherical profile, as illustrated in FIG. 2C, can be formed. The aspherical profile can be controlled by relationships between the size of the plated layer 8, characteristics of the curable organic solution, spin-coat conditions, hardening conditions, and so forth. Here, an organic material and an inorganic solution, such as a sol-gel solution containing metal ions, can be used as long as it has an appropriate surface tension and it is a curable material.

Figure 2D:
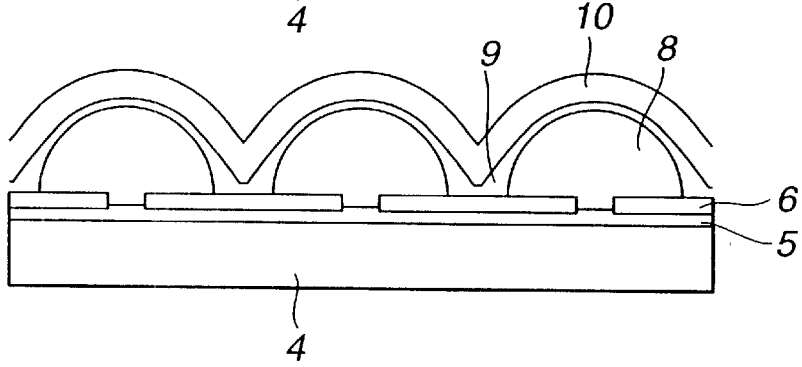

Pt is then layered with a thickness of 200 nm on the spin-coat layer 9 using a sputtering method. An electrode layer 10 for forming an electroplated layer thereon is thus formed. Ni electroplating is then performed while the above electrode layer 10 is used as a cathode. A Ni electroplating bath containing nickel (II) sulfate, nickel (II) chloride, boric acid and brightener is used. The electroplating is conducted for forty (40) minutes at the bath temperature of 50° C. and the cathode current density of 40 A/dm$^2$. A fly-eye structure is thus constructed, and a mold for forming an aspherical fly-eye microlens can be obtained, as illustrated in FIG. 2D.

Figure 8A:
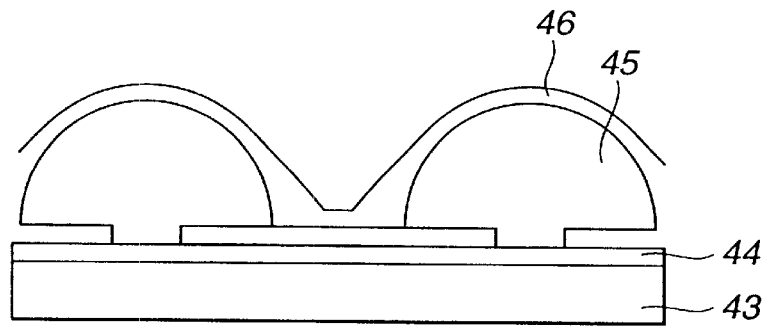
FIGS. 8A to 8C are cross-sectional views illustrating the principle of forming a fly-eye structure of the present invention.
Figure 8B:
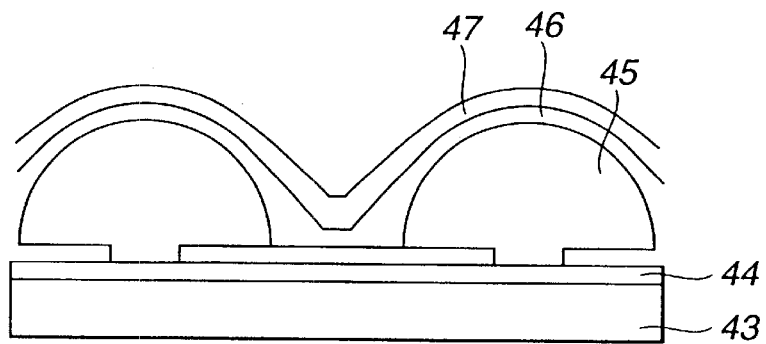
Figure 8C:
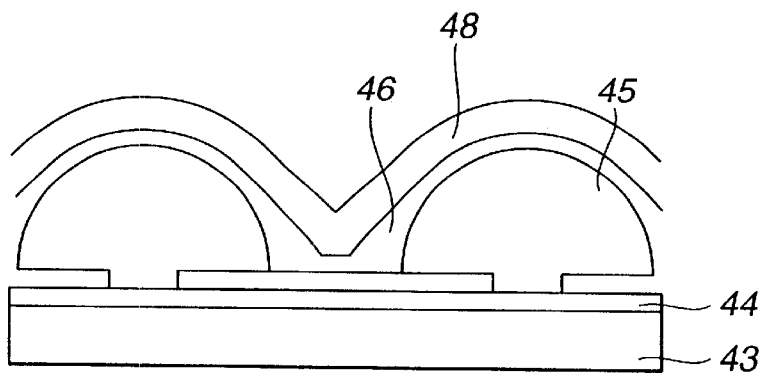

The principle of forming a fly-eye forming layer will be described by using an example illustrated in FIGS. 8A to 8C. A substrate 43, an electrode layer 44, an electroplated layer 45, and an aspherical-profile forming layer 46, illustrated in FIG. 8A, are formed in the same manners as above. A fly-eye forming layer 47 or 48 is then formed as illustrated in FIGS. 8B and 8C, respectively, such that the sides of adjacent protruding microstructures are brought into contact with each other. The fill-factor is thus increased. An optical use efficiency of an aspherical microlens array obtained by using this substrate as a mold can be further improved.

Figure 3A:
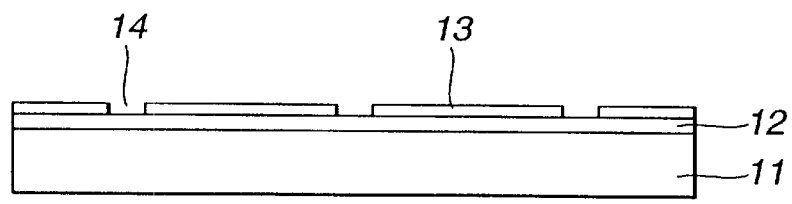
FIGS. 3A to 3D are cross-sectional views illustrating steps of fabricating a mold for an aspherical microlens array of a second embodiment according to the present invention.
Figure 3B:
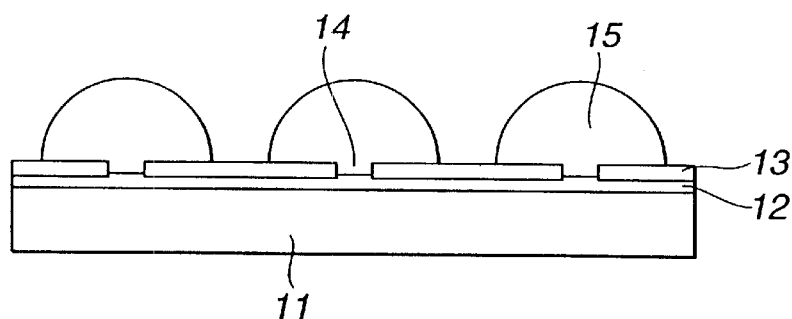

A second embodiment of a mold for an aspherical microlens array of the present invention will be described with reference to FIGS. 3A to 3D. In the second embodiment, a substrate 11, an electrode layer 12, and an insulating mask layer 13 with a plurality of openings 14, as illustrated in FIG. 3A, are formed in the same manners as those of the first embodiment, respectively. An approximately-semispherical electroplated layer 15, as illustrated in FIG. 3B, is also formed in the same manner as that of the first embodiment.

Figure 3C:
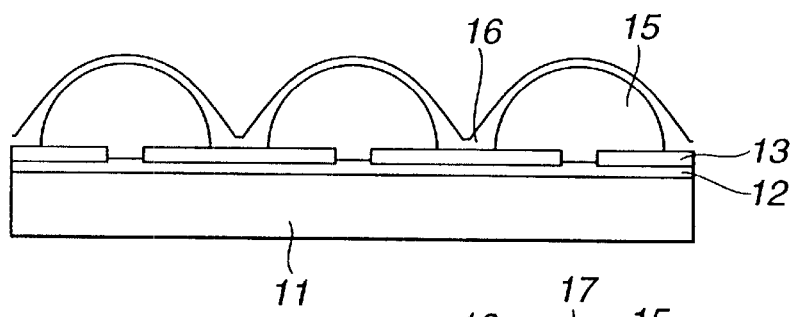

Then, the substrate 11 with the plated layer 15 is dipped into a photoresist with a viscosity coefficient of about 1 cP which is the same as the photoresist used in the photolithography process. A dip-coat layer 16 is thus formed on the plated layers 15 and the mask layer 13. Also here, an aspherical shape is formed due to a surface tension of the photoresist of the dip-coat layer 16, as illustrated in FIG. 3C. Immediately after the dip-coating, the photoresist is thermally hardened at 120° C. for ten (10) minutes to form the dip-coat layer 16 of the photoresist. When the dip-coat method is used, the thickness and the shape of the aspherical-profile forming layer 16 can be controlled by the viscosity coefficient of a solution, and so forth. When the aspherical-profile forming layer 16 obtained by the above coating method must be hardened by heat, radiation, electron beam, or the like, the aspherical-profile can also be controlled by leaving the layer 16 undisturbed for a period until it is hardened.

Fe is then layered with a thickness of 200 nm on the dip-coat layer 16 using a sputtering method. An activation layer 17 for forming an electroless plated layer is thus formed.

Figure 3D:
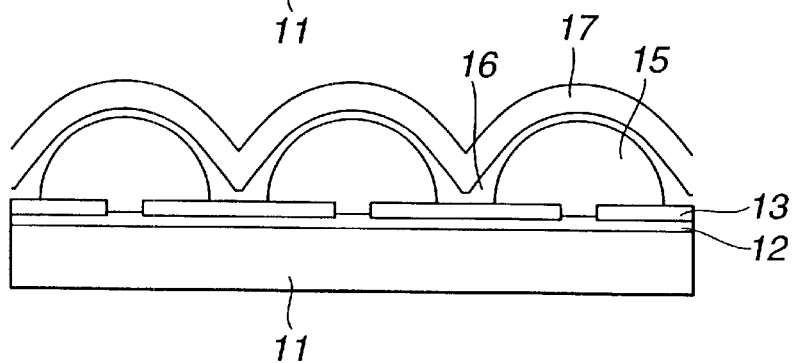

Ni electroless plating is then performed. A Ni electroless plating liquid (S-780 (product name) produced by Nihon Kanizen Com.), containing sodium hypophosphite as a reducing agent, is used. The electroless plating is conducted for about forty (40) minutes at the bath temperature of 90° C. and the cathode current density of 40 A/dm$^2$. A fly-eye structure is thus constructed, and a mold for forming an aspherical fly-eye microlens can be obtained as illustrated in FIG. 3D.

Figure 4A:
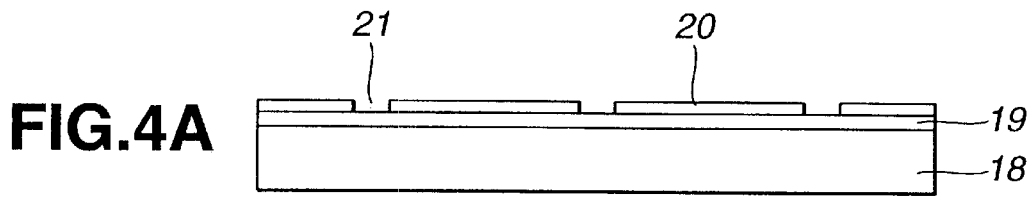
FIGS. 4A to 4E are cross-sectional views illustrating steps of fabricating a mold for an aspherical microlens array of a third embodiment according to the present invention.
Figure 4B:
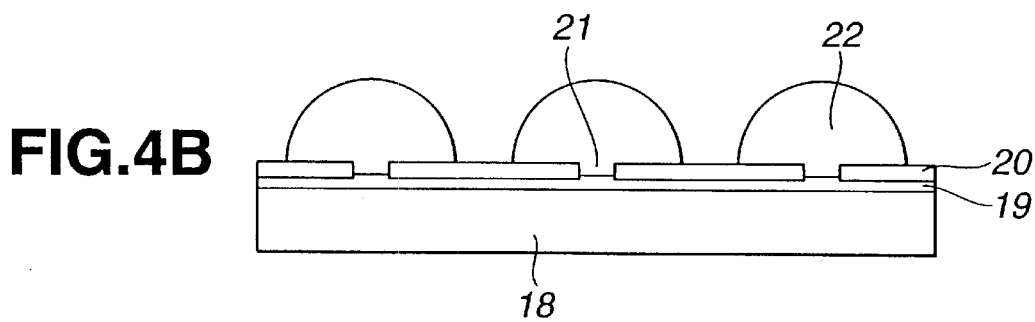

A third embodiment of a mold for an aspherical microlens array of the present invention will be described with reference to FIGS. 4A to 4E. In the third embodiment, a substrate 18, an electrode layer 19, and an insulating mask layer 20 with openings 21, as illustrated in FIG. 4A, are formed in the same manners as those of the first embodiment, respectively. An approximately-semispherical electroplated layer 22, as illustrated in FIG. 4B, is also formed in the same manner as that of the first embodiment.

Figure 4C:
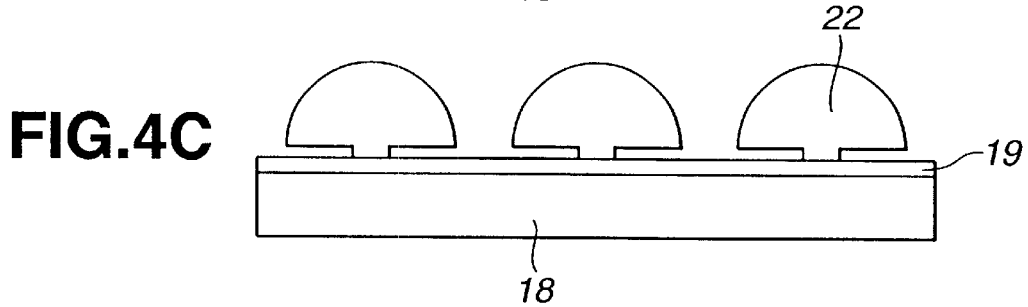

Then, the mask layer 20 is removed by acetone, DMF (dimethylformamide), and ashing, as illustrated in FIG. 4C. There is no need to remove the mask layer 20 when the mask layer 20 has no adverse influences. In structures illustrated in FIGS. 4D and 4E, the mask layer 20 is left.

Figure 4D:
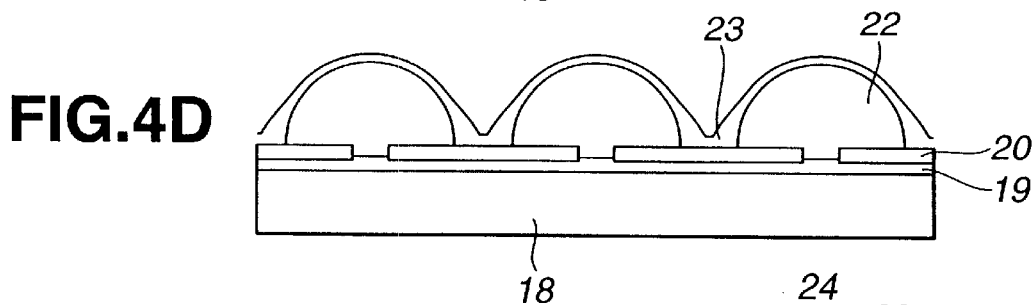

A CVD layer 23 of phospheric-acid glass is then deposited to a thickness of about 1.5 μm on the substrate, using a plasma CVD method. Thereafter, the CVD layer is thermally processed at 800° C. for five (5) minutes to form a CVD layer 23 with an aspherical profile, as illustrated in FIG. 4D.

Figure 4E:
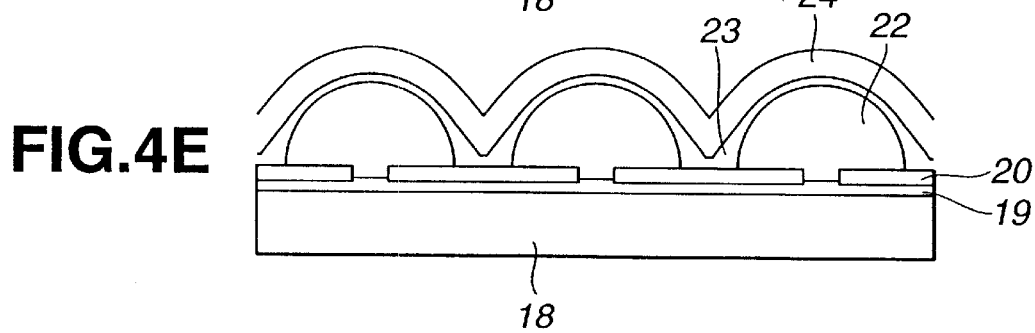

As discussed above, a plastic material is coated on the spherical plated layer 22 and the mask layer 20 using a CVD method to obtain the aspherical-profile forming layer 23. Here, when the condition of the CVD is likely to damage the mask layer 20, the mask layer 20 needs to be removed. When the mask layer 20 is formed of a material bearable to the condition of the CVD, the mask layer 20 is not necessarily removed, as illustrated in FIGS. 4D and 4E. When the material deposited by the CVD method can be plastically deformed by heating, an aspherical profile, as illustrated in FIG. 4D, can be formed due to a surface tension. The aspherical profile can be controlled by the size of the plated layer 22, the characteristics of the material used in the CVD method, the conditions of aspherical-profile processing, and so forth.

Further, a CVD layer 24 of phospheric-acid glass is deposited to a thickness of about 10 μm on the CVD layer 23, using a plasma CVD method. A fly-eye structure is thus constructed, and a mold for forming an aspherical fly-eye microlens can be obtained, as illustrated in FIG. 4E.

Figure 7A:
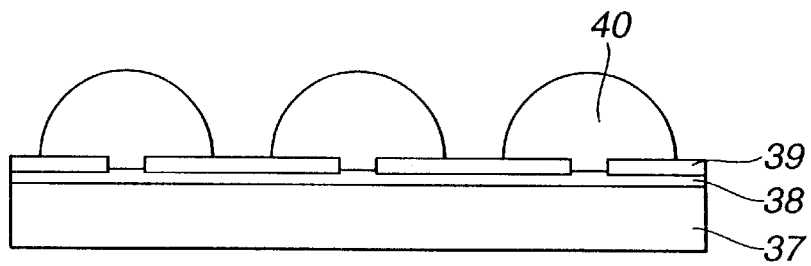
FIGS. 7A to 7D are cross-sectional views illustrating steps of fabricating a mold for an aspherical microlens array of a modification of the third embodiment according to the present invention.
Figure 7B:
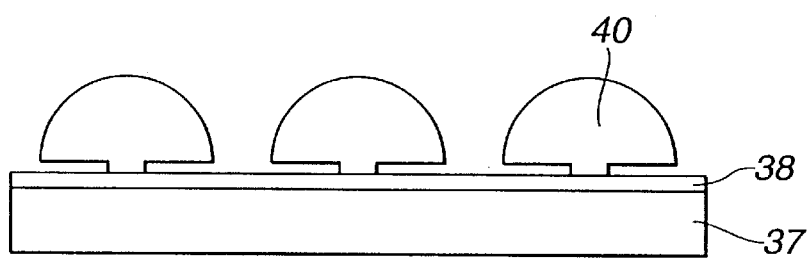
Figure 7C:
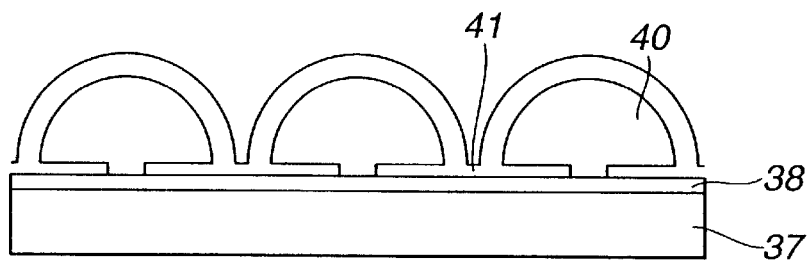
Figure 7D:
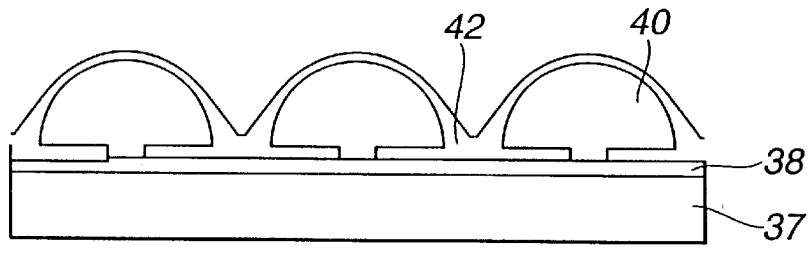

A common layer can be employed to construct both the aspherical shape and the fly-eye structure. In this method, as illustrated in FIGS. 7C and 7D, a CVD layer 41 is deposited to a relatively large thickness, and the CVD layer 41 is thermally processed to form an aspherical CVD layer 42 with the fly-eye structure. Also herein, a substrate 37, an electrode layer 38, and an insulating mask layer 39 with openings, as illustrated in FIG. 7A, are formed in the same manners as those of the first embodiment, respectively. An approximately-semispherical electroplated layer 40, as illustrated in FIG. 7B, is also formed in the same manner as that of the first embodiment.

Figure 5A:
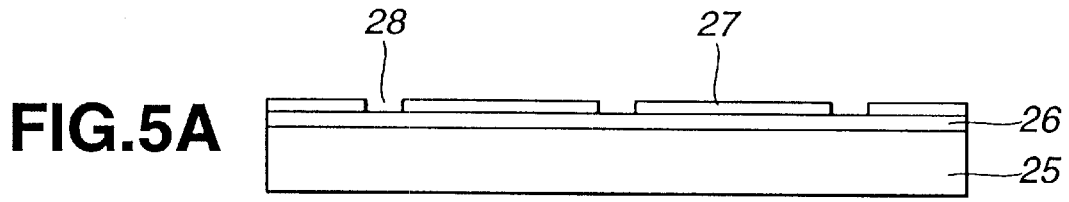
FIGS. 5A to 5E are cross-sectional views illustrating steps of fabricating a mold for an aspherical microlens array of a fourth embodiment according to the present invention.
Figure 5B:
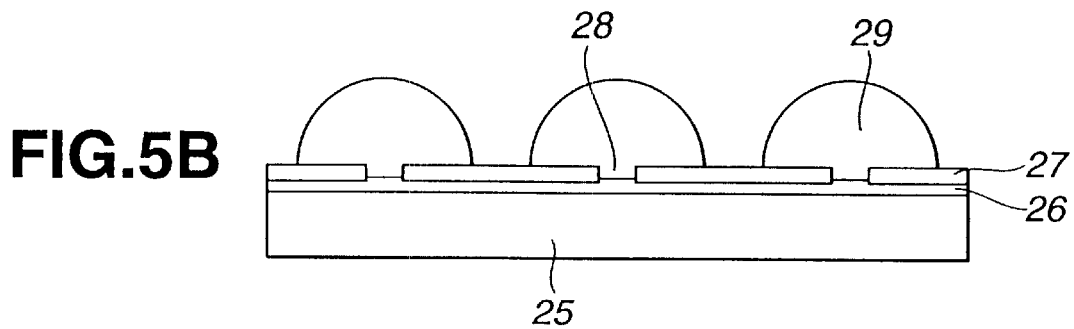

A fourth embodiment of a mold for an aspherical microlens array of the present invention will be described with reference to FIGS. 5A to 5E. In the fourth embodiment, a substrate 25, an electrode layer 26, and an insulating mask layer 27 with openings 28, as illustrated in FIG. 5A, are formed in the same manners as those of the first embodiment, respectively. An approximately-semispherical electroplated layer 29, as illustrated in FIG. 5B, is also formed in the same manner as that of the first embodiment.

Figure 5C:
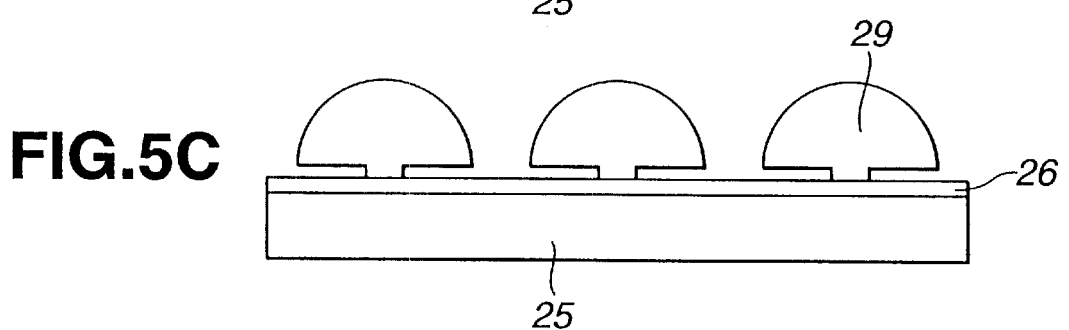
Figure 5D:
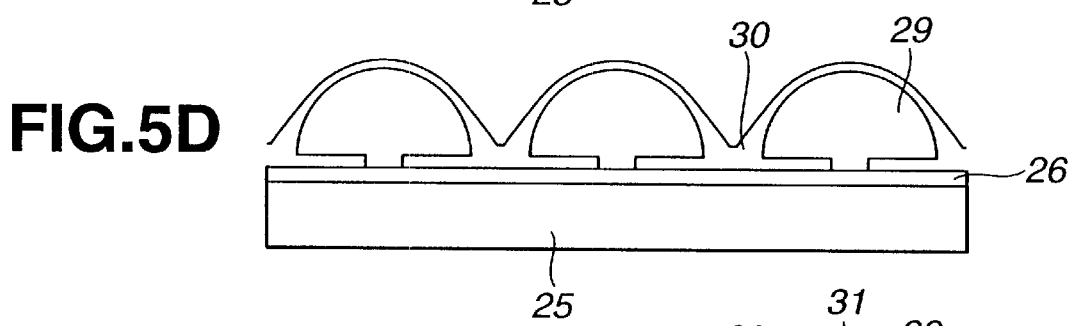

Then, the mask layer 27 is removed by acetone, DMF (dimethylformamide), and ashing, as illustrated in FIG. 5C. A CVD layer 30 of phospheric-acid glass is then deposited to a thickness of about 1.5 μm on the substrate, using a plasma CVD method. Thereafter, the CVD layer 30 is thermally processed at 800° C. for five (5) minutes to form a CVD layer 30 with an aspherical profile, as illustrated in FIG. 5D.

Pt is then layered to a thickness of 200 nm on the CVD layer 30 using a sputtering method. An electrode layer 31 for forming an electroplated layer is thus formed.

Figure 5E:
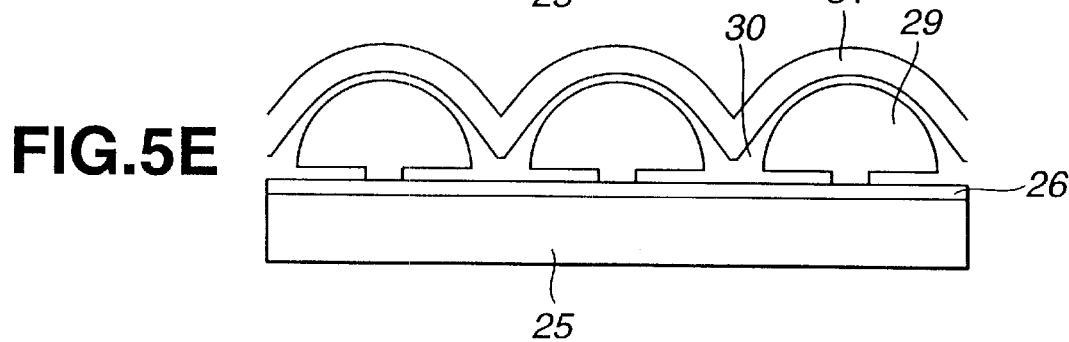

Ni electroplating is then performed while the above electrode layer 31 is used as a cathode. A Ni electroplating bath containing nickel (II) sulfate, nickel (II) chloride, boric acid and brightener is used. The electroplating is conducted for forty (40) minutes at the bath temperature of 50° C. and the cathode current density of 40 A/dm$^2$. A fly-eye structure is thus constructed, and a mold for forming an aspherical fly-eye microlens can be obtained, as illustrated in FIG. 5E.

A fifth embodiment of a mold for an aspherical microlens array of the present invention will be described with reference to FIGS. 6A to 6D.

Figure 6A:
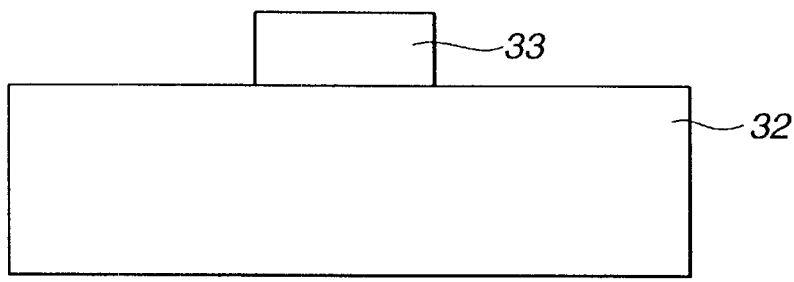
FIGS. 6A to 6D are cross-sectional views illustrating steps of fabricating a mold for an aspherical microlens array of a fifth embodiment according to the present invention.

In the fifth embodiment, a silicon wafer with sides of 1.5 inches×1 inch is used as a substrate 32. The substrate 32 is surface-processed by using a silane coupling agent having functional groups with fluorine, and a water-repelling surface is formed on the wafer 32. A photoresist is then coated to a thickness of 8 μm, and exposure and development of the photoresist are performed by photolithography to form a reflow layer 33 of the photoresist on the wafer 32, as illustrated in FIG. 6A. The reflow layer 33 has a cylindrical shape with a diameter of 16 μm.

Figure 6B:
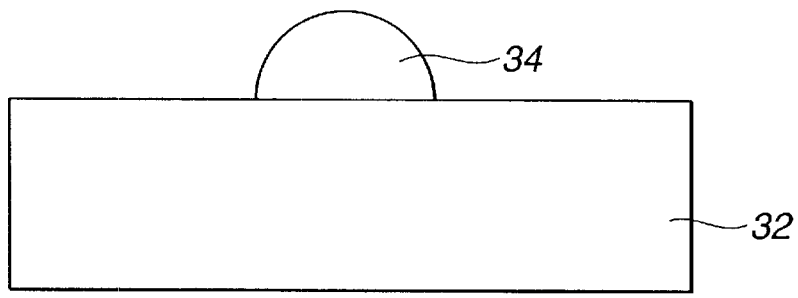

The substrate or wafer 32 is then baked at a temperature of 150° C. for fifteen (15) minutes. The photoresist reflow layer 33 hence undergoes reflow, and an approximately-semispherical reflow layer 34 is formed, as illustrated in FIG. 6B. Here, an angle of contact between the reflow layer 34 and the substrate 32 is about eighty (80) degrees.

Figure 6C:
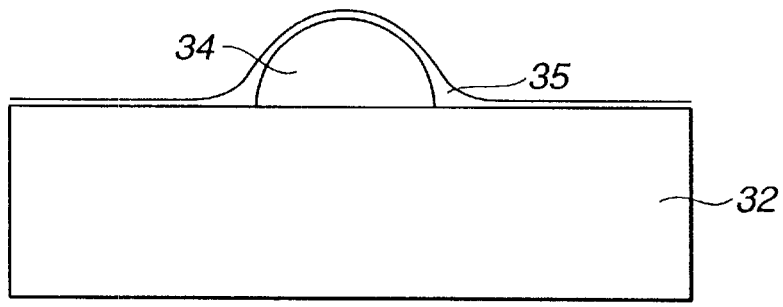

Then, a photoresist with a viscosity coefficient of about 20 cP is spin-coated on the substrate 32 at 3000 rpm for thirty (30) seconds. An aspherical spin-coat layer 35 is thus formed on the reflow layer 34 and the substrate 32. Also here, an aspherical profile is formed due to the surface tension of the photoresist spin-coat layer 35, as illustrated in FIG. 6C. Immediately after the spin-coating, the photoresist is thermally hardened at 120° C. for ten (10) minutes.

Cr is then layered with a thickness of 200 nm on the aspherical spin-coat layer 35 using a sputtering method. A mold for forming an aspherical microlens is thus formed. Alternatively, the thus-fabricated wafer without the Cr layer can be used directly as an aspherical microlens.

As a modified fifth embodiment, another method of fabricating a mold for an aspherical microlens or an aspherical microlens will be described with reference to FIGS. 6A to 6D. Initially, a reflow layer 33 is formed on a substrate 32, as illustrated in FIG. 6A. Here, processes of semiconductor photolithography and etching that are capable of forming a minute opening are used. As the reflow layer 33, a plastic material with a softening temperature lower than that of the substrate 32 is selected. Any material that satisfies this condition, such as photoresist, glass, and metal, can be used as the reflow material. When the photoresist is used as above, the etching process can be omitted.

The reflow layer 33 can have a cylindrical shape, a stripe shape, or a polygonal shape such as a tetragonal pole and a hexagonal pole. The reflow layer 33 can be provided as a single form, or in a one- or a two-dimensional array.

The temperature of the substrate 32 is then raised to a temperature at which a thermal deforming of the reflow layer 33 occurs. The reflow layer 33 is deformed into a spherical shape due to a surface tension, and a reflow layer 34 is formed, as illustrated FIG. 6B. An aspherical processing is then conducted on the reflow layer 34 using a spin-coat method, a dip-coat method, or a CVD method. Thus, an aspherical profile, as illustrated in FIG. 6C, can be obtained.

As described above, the thus-fabricated substrate with the aspherical profile of an aspherical-profile forming layer 35 can be directly used as a mold for an aspherical microlens. Alternatively, the thus-fabricated substrate can be used as such a mold after the surface of the substrate is coated with a material of Cr or the like having excellent chemical stability and mechanical strength.

Figure 6D:
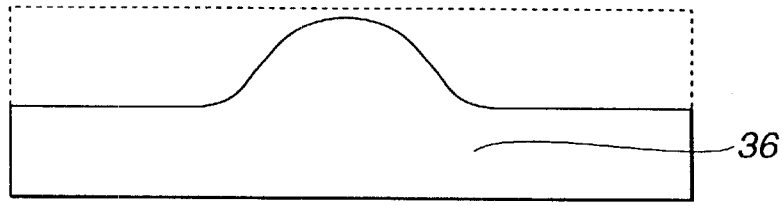

When an anisotropic etching of the substrate 32, the reflow layer 34, and the aspherical-profile forming layer 35 is possible, the aspherical profile can be transferred directly to a mother substrate 36, as illustrated in FIG. 6D. Where the mother substrate 36 is formed of a transparent material, the transferred substrate can be directly used as an aspherical microlens. When the etching rates of the mother substrate 36, the reflow layer 34, and the aspherical-profile forming layer 35 are different, the aspherical profile can be regulated by manipulating or using those differences.

In the above embodiments, when the electroless plating is performed, the deposition amount of the plated layer can be readily controlled by controlling the electroless plating time and the temperature of the electroless plating liquid. The following materials can be used as an electroless plating metal, for example. As a single metal, Ni, Au, Cu, Co and the like can be employed. As an alloy, Co—Fe, Co—W, Ni—Co, Ni—Fe, Ni—W and the like can be used. Any material can be used as long as electroless plating is possible. As a reducing agent, sodium hypophosphite, potassium hypophosphite, sodium borohydride, potassium borohydride, hydrazine, formalin, tartaric acid and the like can be employed. When sodium hypophosphite or potassium hypophosphite is used as the reducing agent, the electroless plated layer contains phosphorus. Hence, corrosion and abrasion resistivities of the plated layer can be improved.

When the CVD is conducted, the deposition amount of a CVD layer can be readily controlled by the depositing conditions, the time, and so forth. As the CVD, thermal CVD, plasma CVD, optical CVD, MO(metal organic)CVD, or metal CVD can be employed. The desired CVD is selected depending on the need. With respect to the kind of deposited substance, a single metal, such as Cu, Be, Al, Ti, Zr, Sn, Ta, Co, Cr, Fe, Si, Ni, Pt, and Pd, can be obtained. Some of them can be obtained as an alloy, a carbide, a nitride, a boride, a silicide, or an oxide.

When the opening in the mask layer is formed in a elongated form and arranged in a one-dimensional or two-dimensional array, a mold for an aspherical lenticular microlens array can be fabricated. When there is only a single opening, a mold for an aspherical microlens can be fabricated.

A concave aspherical microlens array can be fabricated by using the above mold. For example, after an ultraviolet-ray hardening resin is laid down over the convex mold, a glass substrate of a support is placed on the resin. After the resin is exposed to ultraviolet radiation through the glass substrate to be hardened, the glass substrate with the resin is separated from the mold. A concave aspherical microlens array can be thus fabricated.

When a resin having a refractive index larger than that of the above resin is deposited on the concave microlens array and hardened, an aspherical microlens array with a flat surface can be obtained. When the aspherical microlens array is formed as discussed above, there is no need to use alkaline glass. Therefore, as compared with the ion exchange method, limitations to material of the microlens and the support substrate can be greatly reduced.

As a resin for the aspherical microlens array, a thermosetting resin, and an electron-beam hardening resin can also be used. The above structure can also be used as a master mold.

A mold for an aspherical microlens array can be fabricated directly from an original substrate discussed above. Therefore, no expensive equipment is needed, and the mold can be fabricated at low costs. The mold can be mechanically separated from the original substrate. In the case of a large-sized mold, there is a fear that the mold is deformed when separated from the original substrate. Accordingly, the mold can be preferably separated by removing the substrate, the protruding microstructure, and the aspherical-profile forming layer sequentially from the bottom surface.

When a mold is formed after a sacrificial layer is formed on the aspherical-profile forming layer layer or the fly-eye forming layer, the mold can be separated from the substrate by removing the sacrificial layer. In this case, a material of the sacrificial layer is selected such that the mold cannot be corroded by an etchant for etching the sacrificial layer. Where neither the aspherical-profile forming layer layer (or the fly-eye forming layer) nor the substrate is corroded by the etchant for etching the sacrificial layer, the substrate with the aspherical-profile forming layer layer or the fly-eye forming layer can be used as an original substrate a plurality of times. When the original substrate becomes unusable due to damage, contamination and the like after plural uses, another master mold can be fabricated by the same method as above.

As a material of the mold, any material, such as resin, metal, and insulating substance, can be used as long as it can be formed on the substrate with the aspherical-profile forming layer layer or the fly-eye forming layer and separated therefrom. In a simple method of fabricating a mold, a material, such as resin, metal, or fused or dissolved glass, is coated on the substrate with the aspherical-profile forming layer layer or the fly-eye forming layer, and the material is separated from the mold after the material is hardened. When metal is used, metal that will not produce an alloy with the substrate and the aspherical-profile forming layer layer or the fly-eye forming layer is preferably selected.

The mold can also be fabricated as follows, for example. An electrode layer is formed on the aspherical-profile forming layer layer or the fly-eye forming layer, and a mold is formed by electroplating while the substrate is used as a cathode. Where a sacrificial layer is used, an electrode layer for the mold is formed on the sacrificial layer, and electroplating is performed while this electrode layer is used as a cathode.

While the present invention has been described with respect to what is presently considered to be the preferred embodiments, it is to be understood that the invention is not limited to the disclosed embodiments. The present invention is intended to cover various modifications and equivalent arrangements included within the spirit and the scope of the appended claims.

What is claimed is:

1. A method of fabricating an aspherical microstructure, said method comprising the steps of:
   (a) forming a protruding microstructure in a recess on a substrate;
   (b) forming an aspherical-profile forming layer on the substrate and the protruding microstructure, an aspherical profile being formed on the protruding microstructure utilizing a surface tension of the aspherical-profile forming layer; and
   (c) hardening the aspherical-profile forming layer with the aspherical profile being maintained.

2. The method of claim 1, wherein said step (a) includes a step of forming a reflow layer on the substrate, and a step of performing a reflow-processing of the reflow layer to form the protruding microstructure.

3. The method of claim 2, wherein the reflow layer subjected to the reflow-processing has one of an approximately-semispherical shape and an approximately-semicylindrical shape.

4. The method of claim 1, wherein in said step (a) a plurality of the protruding microstructures are formed on the substrate.

5. The method of claim 4, wherein the plurality of the protruding microstructures have a common profile.

6. The method of claim 4, wherein the plurality of the protruding microstructures are regularly arranged.

7. The method of claim 1, wherein the protruding microstructure has one of an approximately-semispherical shape and an approximately-semicylindrical shape.

8. The method of claim 1, wherein in said step (b) the aspherical-profile forming layer is formed using a spin-coat method.

9. The method of claim 1, wherein in said step (b) the aspherical-profile forming layer is formed using a dip-coat method.

10. The method of claim 1, wherein in said step (b) the aspherical-profile forming layer is formed of a plastic material using a chemical vapor deposition (CVD) method.

11. The method of claim 1, wherein in said step (b) the aspherical-profile forming layer is formed of a plastic material using a chemical vapor deposition (CVD) method, and deformed in a thermoplastic manner.

12. The method of claim 1, wherein the substrate, the protruding microstructure, and the aspherical-profile forming layer are formed of transparent material, respectively.

13. The aspherical microstructure of claim 12, wherein said electroplated or electrodeposited layer has one of an approximately-semispherical shape and an approximately-semicylindrical shape.

14. The method of claim 1, wherein in said step of forming a protruding microstructure in the recess on the substrate, the protruding microstructure extends out of the recess onto a surface of the substrate.

15. A method of fabricating an aspherical microstructure, said method comprising the steps of:
   (a) forming a protruding microstructure on a substrate;
   (b) forming an aspherical-profile forming layer on the substrate and the protruding microstructure, an aspherical profile being formed on the protruding microstructure utilizing a surface tension of the aspherical-profile forming layer; and
   (c) hardening the aspherical-profile forming layer with the aspherical profile being maintained,
   wherein said step (a) includes a step of preparing the substrate with a conductive portion, a step of forming an insulating mask layer on the conductive portion of the substrate, the insulating mask layer having at least one opening therein to expose the conductive portion at the at least one opening, and a step of forming an electroplated or electrodeposited layer in the opening and about a portion of the insulating mask layer around the opening using electroplating or electrodeposition to form the protruding microstructure.

16. The method of claim 15, wherein the at least one opening has one of a circular shape and a slit shape.

17. The method of claim 15, wherein a plurality of the openings formed in the insulating mask layer have a common shape.

18. The method of claim 15, wherein a plurality of the openings formed in the insulating mask layer are regularly arranged.

19. The method of claim 15, wherein the electroplated or electrodeposited layer has one of an approximately-semispherical shape and an approximately-semicylindrical shape.

20. The method of claim 15, wherein in said step (b) the aspherical-profile forming layer is formed after the insulating mask layer formed in said step (a) is removed.

21. A method of fabricating an aspherical microstructure, said method comprising the steps of:

(a) forming a protruding microstructure on a substrate;

(b) forming an aspherical-profile forming layer on the substrate and the protruding microstructure, an aspherical profile being formed on the protruding microstructure utilizing a surface tension of the aspherical-profile forming layer;

(c) hardening the aspherical-profile forming layer with the aspherical profile being maintained; and (d) forming a fly-eye forming layer on the aspherical-profile forming layer to form a fly-eye construction on the plurality of the protruding microstructures.

22. The method of claim 21, wherein the fly-eye forming layer is formed until a fill-factor of the fly-eye construction reaches approximately 100%.

23. The method of claim 21, wherein in said step (d) the fly-eye forming layer is formed using an electroplating method.

24. The method of claim 21, wherein in said step (d) the fly-eye forming layer is formed using an electroless plating method.

25. The method of claim 21, wherein in said step (d) the fly-eye forming layer is formed using a chemical vapor deposition (CVD) method.

26. A method of fabricating a mold for an aspherical microstructure array, said method comprising the steps of:

(a) forming a protruding microstructure in a recess on a substrate;

(b) forming an aspherical-profile forming layer on the substrate and the protruding microstructure, an aspherical profile being formed on the protruding microstructure utilizing a surface tension of the aspherical-profile forming layer; and (c) hardening the aspherical-profile forming layer with the aspherical profile being maintained.

27. The method of claim 26, wherein in said step of forming a protruding microstructure in the recess on the substrate, the protruding microstructure extends out of the recess onto a surface of the substrate.

28. A method of fabricating a mold for an aspherical microlens array, said method comprising the steps of:

(a) forming a protruding microstructure in a recess on a substrate;

(b) forming an aspherical-profile forming layer on the substrate and the protruding microstructure, an aspherical profile being formed on the protruding microstructure utilizing a surface tension of the aspherical-profile forming layer; and (c) hardening the aspherical-profile forming layer with the aspherical profile being maintained.

29. The method of claim 28, wherein in said step of forming a protruding microstructure in the recess on the substrate, the protruding microstructure extends out of the recess onto a surface of the substrate.

30. A method of fabricating an aspherical microlens array, said method comprising the steps of:

(a) forming a protruding microstructure in a recess on a substrate;

(b) forming an aspherical-profile forming layer on the substrate and the protruding microstructure, an aspherical profile being formed on the protruding microstructure utilizing a surface tension of the aspherical-profile forming layer; and (c) hardening the aspherical-profile forming layer with the aspherical profile being maintained, wherein the substrate, the protruding microstructure, and the aspherical-profile forming layer are formed of transparent material, respectively.

31. The method of claim 30, wherein in said step of forming a protruding microstructure in the recess on the substrate, the protruding microstructure extends out of the recess onto a surface of the substrate.

32. An aspherical microstructure comprising:

a substrate;

a protruding microstructure formed in a recess on said substrate; and an aspherical-profile forming layer formed and hardened on said substrate and said protruding microstructure, an aspherical profile being formed on said protruding microstructure utilizing a surface tension of said aspherical-profile forming layer.

33. The aspherical microstructure of claim 32, wherein said substrate is a substrate with a conductive portion, and said protruding microstructure is an electroplated or electrodeposited layer.

34. The aspherical microstructure of claim 32, wherein said protruding microstructure is a reflow layer subjected to a reflow-processing.

35. The aspherical microstructure of claim 34, wherein said reflow layer subjected to the reflow-processing has one of an approximately-semispherical shape and an approximately-semicylindrical shape.

36. The aspherical microstructure of claim 32, wherein a plurality of said protruding microstructures are formed on said substrate.

37. The aspherical microstructure of claim 36, wherein said plurality of said protruding microstructures have a common profile.

38. The aspherical microstructure of claim 36, wherein said plurality of said protruding microstructures are regularly arranged.

39. The aspherical microstructure of claim 32, wherein said protruding microstructure has one of an approximately-semispherical shape and an approximately-semicylindrical shape.

40. The aspherical microstructure of claim 32, wherein the substrate, the protruding microstructure, and the aspherical-profile forming layer are formed of transparent material, respectively.

41. The aspherical microstructure of claim 32, wherein said protruding microstructure extends out of the recess onto a surface of the substrate.

42. An aspherical microstructure comprising:

a substrate;

a protruding microstructure formed on said substrate;

an aspherical-profile forming layer formed and hardened on said substrate and said protruding microstructure, an aspherical profile being formed on said protruding microstructure utilizing a surface tension of said aspherical-profile forming layer; and a fly-eye forming layer formed on said aspherical-profile forming layer to form a fly-eye construction on said plurality of said protruding microstructures, wherein a plurality of said protruding microstructures are formed on said substrate.

43. The aspherical microstructure of claim 42, wherein said fly-eye forming layer is formed until a fill-factor of the fly-eye construction reaches approximately 100%.

44. A mold for an aspherical microstructure array, said mold comprising:

a substrate;

a protruding microstructure formed in a recess on said substrate; and an aspherical-profile forming layer formed and hardened on said substrate and said protruding microstructure, an aspherical profile being formed on said protruding microstructure utilizing a surface tension of said aspherical-profile forming layer.

45. The mold of claim 44, wherein said protruding microstructure extends out of the recess onto a surface of the substrate.

46. A mold for an aspherical microlens array, said mold comprising:

a substrate;

a protruding microstructure formed in a recess on said substrate; and an aspherical-profile forming layer formed and hardened on said substrate and said protruding microstructure, an aspherical profile being formed on said protruding microstructure utilizing a surface tension of said aspherical-profile forming layer.

47. The mold of claim 46, wherein said protruding microstructure extends out of the recess onto a surface of the substrate.

48. An aspherical microlens array comprising:

a substrate;

a protruding microstructure formed in a recess on said substrate; and an aspherical-profile forming layer formed and hardened on said substrate and said protruding microstructure, an aspherical profile being formed on said protruding microstructure utilizing a surface tension of said aspherical-profile forming layer, wherein said substrate, said protruding microstructure, and said aspherical-profile forming layer are formed of transparent material, respectively.

49. The aspherical microlens array of claim 48, wherein said protruding microstructure extends out of the recess onto a surface of the substrate.

* * * * *